(12) United States Patent
Wang et al.

(10) Patent No.: US 10,658,449 B2
(45) Date of Patent: May 19, 2020

(54) PACKAGE SUBSTRATE, METHOD OF MANUFACTURING THE SAME, DISPLAY PANEL AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 15/967,860

(22) Filed: May 1, 2018

(65) Prior Publication Data

US 2019/0067405 A1    Feb. 28, 2019

(30) Foreign Application Priority Data

Aug. 30, 2017  (CN) .......................... 2017 1 0764736

(51) Int. Cl.
*H01L 33/08*    (2010.01)
*H01L 27/32*    (2006.01)
(Continued)

(52) U.S. Cl.
CPC ........ *H01L 27/3276* (2013.01); *H01L 27/322* (2013.01); *H01L 27/3246* (2013.01);
(Continued)

(58) Field of Classification Search
CPC ............. H01L 27/3276; H01L 27/3246; H01L 27/3253; H01L 51/56; H01L 51/0096; H01L 27/322; H01L 23/5225; H01L 1127/14623; H01L 27/14818; H01L 27/3272; H01L 2929/78633; H01L 31/02162; H01L 31/02164; H01L 2021/775; H01L 27/1214; H01L 27/124; H01L 27/3232; H01L 27/14603;
(Continued)

(56) References Cited

U.S. PATENT DOCUMENTS

2010/0123137 A1*  5/2010  Yang .................... H01L 27/1214
                                                           257/59
2011/0085103 A1*  4/2011  Yang ................. G02F 1/136209
                                                           349/43
(Continued)

*Primary Examiner* — Cuong B Nguyen
*Assistant Examiner* — Samuel Park
(74) *Attorney, Agent, or Firm* — Calfee, Halter & Griswold LLP

(57) ABSTRACT

A package substrate includes a base substrate having a light-transmitting region and a non-light-transmitting region, wherein metal electrodes and a spacer located on at least a part of a surface of the metal electrodes away from the base substrate are provided on the base substrate, an orthogonal projection of the spacer on the base substrate is within an orthogonal projection of the metal electrodes on the base substrate, and an orthogonal projection of the metal electrode on the base substrate is within the non-light-transmitting region of the base substrate, and an interval exists between the spacer and the metal electrodes. A method of manufacturing the package substrate is used for manufacturing the above package substrate. The package substrate provided by the present disclosure is used in a display device.

18 Claims, 5 Drawing Sheets

(51) Int. Cl.
*H01L 51/00* (2006.01)
*H01L 51/56* (2006.01)
*H01L 51/52* (2006.01)

(52) U.S. Cl.
CPC ...... *H01L 27/3253* (2013.01); *H01L 51/0096* (2013.01); *H01L 51/525* (2013.01); *H01L 51/5228* (2013.01); *H01L 51/5284* (2013.01); *H01L 51/56* (2013.01); *H01L 51/0024* (2013.01); *H01L 2251/5315* (2013.01)

(58) Field of Classification Search
CPC ......... H01L 27/14605; H01L 27/14609; H01L 27/14812; H01L 27/3248; H01L 27/326; H01L 51/0076
See application file for complete search history.

(56) References Cited

U.S. PATENT DOCUMENTS

| | | | |
|---|---|---|---|
| 2012/0028421 A1* | 2/2012 | Yang | H01L 21/32138 438/158 |
| 2018/0224684 A1* | 8/2018 | Su | G02F 1/13338 |

* cited by examiner

PACKAGE SUBSTRATE, METHOD OF MANUFACTURING THE SAME, DISPLAY PANEL AND DISPLAY DEVICE

CROSS REFERENCE

The present application claims the priority of Chinese Patent Application No. 201710764736.X, and filed on Aug. 30, 2017, and the entire contents thereof are incorporated herein by reference.

TECHNICAL FIELD

The present disclosure relates to the field of display technologies, and in particular, to a package substrate, a method of manufacturing the same, a display panel, and a display device.

BACKGROUND

The organic light emitting display device is a self-luminous display device, which can realize self-luminous and has characteristics of ultra-thin, high contrast, ultra-wide viewing angle, and low power consumption, and is widely popular among users. Currently, an OLED display substrate in an organic light emitting display device includes an array substrate, and an OLED array formed on the array substrate. A package substrate is further formed on a surface of the OLED array away from the array substrate. The package substrate has an organic package layer to package the OLED array, thus preventing the moisture from influencing the OLED array. During the display, the OLED array is controlled to emit light through the array substrate, to realize image display.

It should be noted that, information disclosed in the above background portion is provided only for better understanding of the background of the present disclosure, and thus it may contain information that does not form the prior art known by those ordinary skilled in the art.

SUMMARY

The present disclosure provides technical solutions as follows:

A package substrate is provided, the package substrate including a base substrate having a light-transmitting region and a non-light-transmitting region, wherein metal electrodes and a spacer located on at least a part of a surface of the metal electrodes away from the base substrate are provided on the base substrate, an orthogonal projection of the spacer on the base substrate is within an orthogonal projection of the metal electrodes on the base substrate, and an orthogonal projection of the metal electrode on the base substrate is within the non-light-transmitting region of the base substrate, and an interval exists between the spacer and the metal electrodes.

The present disclosure further provides a display panel, including the package substrate according to the above technical solutions, and an array substrate forming a cell assembly with the package substrate, wherein a metal electrode of the package substrate is connected to a light-transmitting electrode on a surface of the array substrate.

The present disclosure further provides a display device, including the display panel according to the above technical solutions.

The present disclosure further provides a method of manufacturing a package substrate, including:

providing a base substrate; the base substrate having a light-transmitting region and a non-light-transmitting region;

forming metal electrodes on the base substrate;

forming a spacer on at least a part of a surface of the metal electrodes away from the base substrate, wherein an orthogonal projection of the spacer on the base substrate is within an orthogonal projection of the metal electrodes on the base substrate, and an orthogonal projection of the metal electrode on the base substrate is within the non-light-transmitting region of the base substrate; and an interval exists between the spacer and the metal electrodes.

It is to be understood that both the foregoing general description and the following detailed description are exemplary and explanatory only and are not restrictive of the present disclosure.

BRIEF DESCRIPTION OF THE DRAWINGS

The drawings are intended to provide a further understanding of the present disclosure and constitute a part of the present disclosure. The exemplary embodiments of the present disclosure and the description thereof are used to explain the present disclosure and do not constitute inappropriate limitations to the present disclosure. In the drawing.

DETAILED DESCRIPTION

Figure 1:
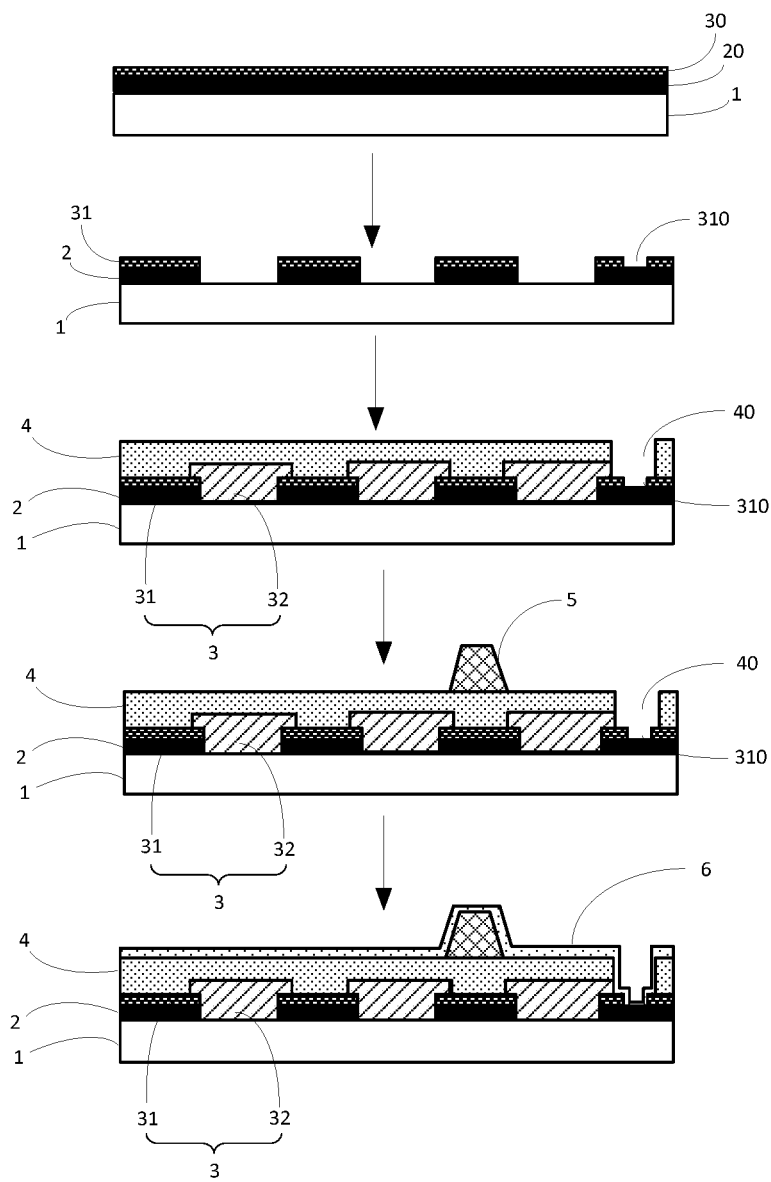
FIG. 1 is a flow chart of manufacturing a first kind of package substrate with light-transmitting electrodes according to an embodiment of the present disclosure.

The following will clearly and completely describe the technical solutions in the embodiments of the present disclosure with reference to the accompanying drawings in the embodiments of the present disclosure. Apparently, the described embodiments are merely a part of the embodiments of the present disclosure and not all of the embodiments. All other embodiments obtained by a person of ordinary skill in the art based on the embodiments of the present disclosure without creative efforts shall fall within the protection scope of the present disclosure.

Referring to FIGS. 2, 4, 6 and 8, a package substrate provided by an embodiment of the present disclosure includes a base substrate 1 having a light-transmitting region and a non-light-transmitting region, wherein metal electrodes 2 and a spacer 5 located on at least a part of a surface of the metal electrodes 2 away from the base substrate 1 are provided on the base substrate 1, an orthogonal projection of the spacer 5 on the base substrate 1 is within an orthogonal projection of the metal electrodes 2 on the base substrate 1, and an orthogonal projection of the metal electrodes 2 on the base substrate 1 is within the non-light-transmitting region of the base substrate 1, and a spacer is provided on the surface of the planarization layer.

Those skilled in the art can easily understand that the light-transmitting region in the above-mentioned package substrate may correspond to the pixel display region on the array substrate packaged by the package substrate, and is used to transmit the light emitted from the pixels during the display; and the non-light-transmitting region may correspond to a pixel defining layer pattern on the array substrate packaged by the package substrate, for example, pixel defining partition walls between the pixels.

As shown in FIGS. 1, 3, 5, and 7, when a package substrate provided by an embodiment of the present disclosure is manufactured, a manufacturing method thereof includes following steps:

in the first step, providing a base substrate 1; the base substrate 1 having a light-transmitting region and a non-light-transmitting region;

in the second step, forming metal electrodes 2 on the base substrate 1;

in the third step, forming a spacer 5 on at least a part of a surface of the metal electrodes 2 away from the base substrate 1, wherein an orthogonal projection of the spacer 5 on the base substrate 1 is within an orthogonal projection of the metal electrodes 2 on the base substrate 1, and an orthogonal projection of the metal electrodes 2 on the base substrate 1 is within the non-light-transmitting region of the base substrate 1; and an interval exists between the spacer 5 and the metal electrodes 2.

In addition, in the package substrate provided in the embodiment of the present disclosure, as long as the metal electrode 2 therein is not in contact with the spacer 5, the metal electrode 2 may be provided on a selected position above the non-light-transmitting region of the base substrate 1 according to requirements of the process design. Based on this, in the manufacturing method of the package substrate provided by the embodiments of the present disclosure, an order of forming the metal electrodes 2 can be adjusted according to actual situations of the positions where the metal electrodes 2 are formed.

Through the above description of the structure of the package substrate and the manufacturing method thereof, it can be found that there is an interval between the spacer 5 and the metal electrodes 2, such that the metal electrodes 2 and the spacer 5 are not in contact, and the problem of peeling off the spacer 5 from the metal electrodes 2 is eliminated. The package substrate already has an organic package layer, in addition to the metal electrodes 2, that is, the spacer 5 may be formed on the organic package layer, and the organic material used by the organic package layer and the material used by the spacer 5 have good material compatibility, which makes that the spacer 5 can be well attached to the organic package layer when the spacer 5 is not in contact with the metal electrodes 2. Therefore, the package substrate provided by the present disclosure can solve the problem that the spacer 5 is peeled from a surface of the metal electrode 2 due to the poor adhesion of the spacer 5 on the surface of the metal electrode 2.

It should be noted that, as for the metal electrode 2, the metal electrode 2 may be not only an ordinary elemental metal film and an alloy film, but it may be also a composite multi-layer film. The composite multi-layer film includes a first alloy film and a second alloy film that are laminated and an elemental metal film provided between the first alloy film and the second alloy film. Since the alloy film has good oxidation resistance, when the material used for the elemental metal film is an elemental metal that is relatively easily oxidized, the first alloy film and the second alloy film can be used in this case to protect the elemental metal film, so as to avoid oxidation of the elemental metal film.

Optionally, the material used for the elemental metal film includes Mo, Al, Ti, Au, Cu, Nd, Hf, or Ta, and the alloy film includes alloys formed by at least two of Mo, Al, Ti, Nd, Au, Cu, Hf, and Ta, such as AlNd, MoNb or the like.

In order to improve the display effect of the OLED display panel using the package substrate, as shown in FIG. 1, the embodiment of the present disclosure provides a first kind of package substrate, in which the metal electrodes 2 are disposed on a surface of the non-light-transmitting region of the base substrate 1 and a planarization layer 4 is further provided above the metal electrodes 2. A spacer 5 is provided on a surface of the planarization layer 4 away from the metal electrode 2, so that the spacer 5 is not in contact with the metal electrode 2. Since both the material used by the planarization layer 4 and the material used by the spacer 5 are made of organic materials, the spacer 5 can be well attached to the surface of the planarization layer 4.

An orthogonal projection of the planarization layer 4 on the base substrate 1 covers the non-light-transmitting region and the light-transmitting region of the base substrate 1, so that an orthogonal projection of the metal electrodes 2 on the base substrate 1 is within an orthogonal projection of the planarization layer on the base substrate 1. Considering that the orthogonal projection of the planarization layer 4 on the base substrate 1 covers the non-light-transmitting region and the light-transmitting region of the base substrate 1, the planarization layer 4 used herein is light transmitting, so as not to affect the light to pass through the package substrate.

In addition, since the metal electrode 2 is formed on the surface of the base substrate 1, the metal electrode 2 is in contact with the base substrate 1, and surfaces of the base substrate 1 and the metal electrode 2 are relatively smooth, so that the metal electrode 2 can be well formed on the base substrate 1, and thus the possibility of the metal electrode 2 peeling from the surface of the base substrate 1 is reduced, and the problem that the adhesion force is poor caused by forming the metal electrode 2 on the surface of the planarization layer 4 is further solved.

In one embodiment, as shown in FIG. 1, a black matrix 31 is provided between the metal electrode 2 and the planarization layer 4, and an orthogonal projection of the metal electrodes 2 on the base substrate 1 is within an orthogonal projection of the black matrix 31 on the base substrate 1. When the package substrate provided in this embodiment is used in an organic light emitting display device, if natural light from outside is emitted from a direction of the planarization layer 4 toward the base substrate 1, the black matrix can block the natural light from directly irradiating on the metal electrode 2, thereby avoiding the metal electrode 2 from reflecting the natural light outwards, so that the natural light can be further irradiated into the OLED display substrate through the package substrate, and the contrast of the image displayed by the organic light emitting display device is improved.

Figure 2:
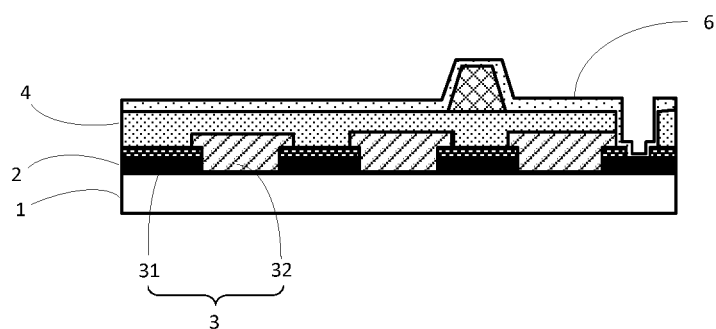
FIG. 2 is a schematic structural diagram of a first kind of package substrate with light-transmitting electrodes according to an embodiment of the present disclosure.

It should be noted that, as shown in FIG. 2, in the above embodiment, the black matrix 31 is disposed between the metal electrode 2 and the planarization layer 4. In other words, the black matrix 31 is substantially disposed on a surface of the metal electrode 2 away from the base substrate 1. The orthogonal projection of the metal electrodes 2 on the base substrate 1 is within the orthogonal projection of the black matrix 31 on the base substrate 1, so when the package substrate is manufactured, as shown in FIG. 1, a layer of metal material may be sputtered on a surface of the base substrate 1, and then a layer of light-shielding material is deposited on the surface of metal layer 20 to form a light-shielding layer 30, and then a patterning process is used to pattern the metal layer 20 and the light-shielding layer 30 by one time. In the embodiment, the patterned metal layer 30 is referred to as a metal electrode 2, and the patterned light shielding layer 30 is referred to as a black matrix 31.

Considering that the metal electrode 2 has light shielding properties, the orthogonal projection of the black matrix 31 on the base substrate 1 covers the orthogonal projection of the metal electrode 2 on the base substrate 1, so that the metal electrode 2 does not affect the normal light transmission efficiency.

In one embodiment, when the OLED display substrate is packaged by using the package substrate of the first structure described above, a light-transmitting electrode 6 is further included. The light-transmitting electrode 6 is located above the surface of the spacer and the planarization layer away from the base substrate. The projection of the light-transmitting electrode 6 covers the light-transmitting region and the non-light-transmitting region of the substrate. Through the light-transmitting electrode 6, the metal electrode 2 is electrically connected to the corresponding light-transmitting electrode 6 on the surface of the array substrate, so as to reduce the IR Drop (resistance drop) caused by the large resistance of the light emitting device on the array substrate. The light-transmitting electrodes 6 is configured to be consistent with that of the corresponding light-transmitting electrode on the surface of the array substrate, for example, it is a transparent cathode in a top-emitting AMOLED structure, or it is a cathode or an anode in a PMOLED structure, or the like. In the embodiment, the electrical connection structure of the metal electrode 2 and the light-transmitting electrode 6 can be realized by the following structure. Of course, other feasible structures can also be used, which will not be described here.

For example, as shown in FIG. 2, the black matrix 31 is provided with a non-light-transmitting region via hole 310, and an orthogonal projection of the non-light-transmitting region via hole 310 on the base substrate 1 is within an orthogonal projection of the metal electrodes 2 on the base substrate 1, and an orthogonal projection of the spacer 5 on the base substrate 1 is independent from an orthogonal projection of the non-light-transmitting region via hole 310 on the base substrate 1. The planarization layer 4 is provided with a planarization layer via hole 40 communicating with the non-light-transmitting region via hole 310, and an orthogonal projection of the non-light-transmitting region via hole 310 on the base substrate 1 at least partially coincides with an orthogonal projection of the planarization layer via hole 40 on the base substrate 1. The light-transmitting electrode 6 is electrically connected to the metal electrode 2 through the planarization layer via hole 40 and the non-light-transmitting region via hole 310.

In the embodiment, the orthogonal projection of the non-light-transmitting region via hole 310 on the base substrate 1 may not completely coincide with the orthogonal projection of the planarization layer via hole 40 on the base substrate 1, as long as the orthogonal projection of non-light transmitting region via hole 310 on the base substrate 1 overlaps with the orthogonal projection of the planarization layer via hole in the base substrate 1, so that when the light-transmitting electrode 6 is formed, the material of the light-transmitting electrode 6 can pass through the corresponding overlapping region formed in the non-light-transmitting region via hole 310 and the planarization layer via hole 40, thus achieving the electrical connection of the metal electrode 2 and the light-transmitting electrode 6.

It is easy to understand that, based on the difference of the light emitting display structure, there are two kinds of light emitting manners, i.e., RGB three-primary color OLED and WOLED. When the WOLED is used as a display pixel, as shown in FIG. 2, in the package substrate provided by the embodiment of the present disclosure, a color resist 32 may be further formed in an opening region of the black matrix 31. An orthogonal projection of the color resist 32 on the base substrate 1 is located in the light-transmitting region of the base substrate 1, and the black matrix 31 and the color resist 32 constitute the color filter layer 3 jointly. The light emitted by the WOLED into the package substrate passes through the opening region of the black matrix 31, which enables the color resist 32 to colorize the light transmitted through the opening region of the black matrix 31. In addition, the color resist 32 covers a part of the surface of the black matrix 31, so that the color resist 32 can be stably formed in the opening region of the black matrix 31.

In addition, forming the color resist 32 in the opening region of the black matrix 31 is not only applicable to light emission of the WOLED, but may also be used in an OLED display substrate with poor RGB three-primary color OLED light emission effect, so as to improve the color of the image displayed by the OLED display substrate.

Figure 4:
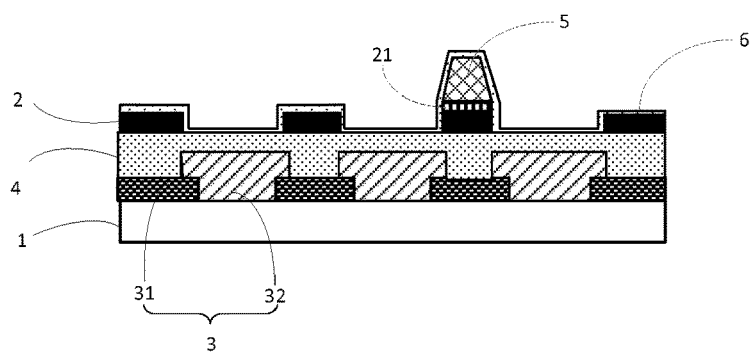
FIG. 4 is a schematic structural diagram of a second kind of package substrate with light-transmitting electrodes according to an embodiment of the present disclosure.
Figure 6:
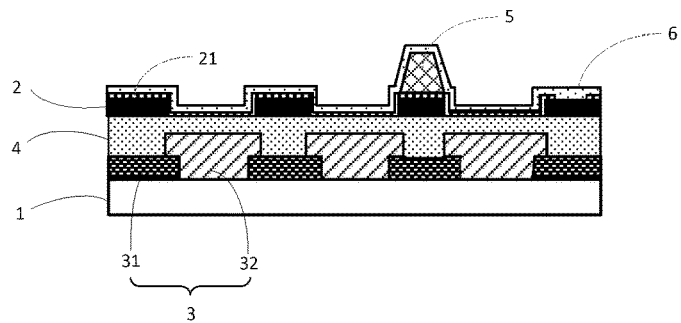
FIG. 6 is a schematic structural diagram of a third kind of package substrate with light-transmitting electrodes according to an embodiment of the present disclosure.
Figure 8:
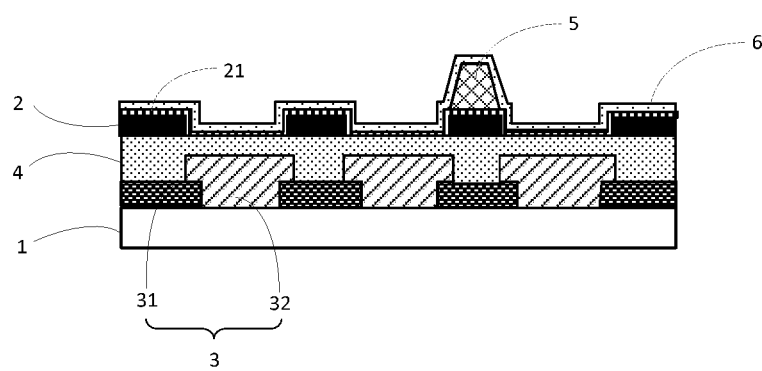
FIG. 8 is a schematic structural diagram of a fourth kind of package substrate with light-transmitting electrodes according to an embodiment of the present disclosure.

In an embodiment of the present disclosure, as shown in FIGS. 4, 6 and 8, at least a part of a surface of the metal electrodes 2 is provided with a transition layer 21, and the spacer 5 is located on a surface of the transition layer 21 away from the metal electrode 2. The adhesion force between the spacer 5 and the transition layer 21 is defined to be greater than the adhesion force between the spacer 5 and the metal electrode 2, so that the possibility of peeling of the spacer 5 can be reduced.

Optionally, the thickness of the transition layer 21 is determined according to actual conditions. For example, in a general package substrate, the transition layer 21 has a thickness of 20 nm to 50 nm. In this case, the spacer 5 can be well attached on the transition layer 21, and the thickness of the package substrate will not be increased too much at the same time.

In the following, two cases of the transition layer 21 being an insulating transition layer and a conductive transition layer are respectively described, and the following description is only used to explain the embodiments of the present disclosure and not as a limitation.

The first case, when the transition layer 21 is an insulating transition layer, the package substrate provided by the embodiment of the present disclosure may adopt the package substrate of the second structure as shown in FIG. 4, or may adopt the package substrate of the third structure as shown in FIG. 6.

As shown in FIG. 4, in the package substrate of the second structure provided by the embodiment of the present disclosure, the spacer 5 is formed only on a part of the metal electrodes 2 without being formed on any other places. In this way, when the OLED display panel is packaged by the substrate package of the second structure, the light-transmitting electrode 6 connected to the light-transmitting electrode on the surface of the array substrate is formed on the surface of the spacer 5 away from the metal electrode 2, and on the surface of the metal electrode 2 with no spacer 5 formed, so that the light-transmitting electrode 6 is electrically connected to the metal electrode 2.

The orthogonal projection of the spacer 5 on the base substrate 1 is located in the orthogonal projection of the metal electrode 2 on the base substrate 1, and the spacer 5 is formed on a part of the metal electrodes 2, and the orthogonal projection of the metal electrode 2 on the base substrate 1 is located in the non-light-transmitting region of the base substrate 1. Therefore, the orthogonal projection of the spacer 5 on the base substrate 1 is located in the non-light-transmitting region of the base substrate 1. In this case, the transition layer 21 in the embodiment of the present disclosure may be a light-transmitting insulating transition layer or a light-shielding insulating transition layer, which does not need to be particularly limited.

As shown in FIG. 6, in the package substrate of the third structure provided by the embodiment of the present disclosure, considering that the insulating transition layer is formed on the surface of all the metal electrodes 2, and when the package substrate provided by the embodiment of the present disclosure packages the OLED display panel, a transition layer via hole 210 is provided on the insulating transition layer, so that the light-transmitting electrode in the OLED display substrate is electrically connected with the metal electrode 2 through the transition layer via hole 210. The orthogonal projection of the transition layer via hole 210 on the base substrate 1 is located in the orthogonal projection of the metal electrode on the base substrate 1, the orthogonal projection of the spacer 5 on the base substrate 1 and the orthogonal projection of the transition layer via hole 210 on the base substrate 1 are independent of each other, so that the transition layer via hole 210 is formed only on the insulating transition layer, to avoid the transition layer via hole 210 from affecting the uniformity of the light transmission.

At the same time, the orthogonal projection of the spacer 5 on the base substrate 1 and the orthogonal projection of the transition layer via hole 210 on the base substrate 1 are independent of each other, so that the transition layer via hole 210 does not affect the support strength of the spacer 5.

Optionally, the insulating transition layer is only formed on all metal electrodes, and the insulating transition layer may be a light-transmitting insulating transition layer, or may also be a light-shielding insulating transition layer. Alternatively, the insulating transition layer may be formed not only on surfaces of some metal electrodes or all metal electrodes, it may also be formed on the light-transmitting region of the base substrate 1. In this case, the insulating transition layer may be a light-transmitting insulating transition layer, so that the insulating transition layer does not affect the light transmitting through the package substrate.

It should be noted that, when the transition layer 21 is an insulating transition layer, the package substrate of the second structure and the package substrate of the third structure provided by the embodiment of the present disclosure do not change the position of the metal electrode 2, but only the insulating transition layer is formed on the surface the metal electrode 2. In addition, the adhesion force between the spacer 5 and the insulating transition layer is greater than the adhesion force between the spacer 5 and the metal electrode 2 (as long as the adhesion force between the spacer 5 and the insulating transition layer is greater that the adhesion force between the spacer 5 and the second type of metal electrode), it may solve the problem that the spacer 5 is peeled from the surface of the metal electrode 2 due to the poor adhesion of the spacer 5 to the surface of the metal electrode 2.

The transition layer 21 can select either an organic transition layer or an oxide transition layer. When the material of the insulating transition layer is one or more of hexamethyldisilazane, $SiO_x$, $SiN_x$, $SiON_x$, the adhesion force between the spacer 5 and these materials is greater than the adhesion force between the spacer 5 and the metal electrode 2.

In a second case, the transition layer 21 is a conductive transition layer, as a package substrate of the fourth structure shown in FIG. 8. In the package substrate based on the fourth structure provided in the embodiment of the present disclosure, the conductive transition layer not only covers the surface of the metal electrodes, but also covers the light-transmitting region of the base substrate 1. Therefore, the conductive transition layer transmits light, which will not affect the light passing through the package substrate.

When the package substrate of the fourth structure provided by the embodiment of the present disclosure packages the OLED display substrate, the light-transmitting electrode 6 can be directly formed on the surface of the conductive transition layer and the surface of the spacer 5, so that the light-transmitting electrode 6 is electrically connected to the metal electrode 2 through the conductive transition layer. In this case, the adhesion force between the spacer 5 and the conductive transition layer is greater than the adhesion force between the spacer 5 and the metal electrode 2.

In the embodiment, the material of the conductive transition layer can be selected from a wide range of materials, such as one or more of indium tin oxide, aluminum-doped zinc oxide, indium-doped zinc oxide, aluminum-titanium co-doped zinc oxide. The adhesion forces between the spacer 5 and these materials are all greater than the adhesion force between the spacer 5 and the metal electrode 2.

In one embodiment, as shown in FIG. 4, when the transition layer is a conductive transition layer, the conductive transition layer may be a light-transmitting conductive transition layer, or may be a light-shielding conductive transition layer, and the specific reasons may be referred to the previous detailed description for FIG. 4.

It should be noted that, when the transition layer 21 is a conductive transition layer, the package substrate of the fourth structure provided by the embodiment of the present disclosure does not change the position of the metal electrode 2, but only the conductive transition layer is formed on the surface the metal electrode 2. In addition, the adhesion force between the spacer 5 and the conductive transition layer is greater than the adhesion force between the spacer 5 and the metal electrode 2 (for the case where all the spacers 5 are formed on the surface of the first type of metal electrode, as long as the adhesion force between the spacer 5 and the conductive transition layer is greater that the adhesion force between the spacer 5 and the second type of metal electrode), it may solve the problem that the spacer 5 is peeled from the surface of the metal electrode 2 due to the poor adhesion of the spacer 5 to the surface of the metal electrode 2.

Through the above description of the second to fourth package substrates, it can be found that the material of the transition layer 21 can be selected from a wide range, which can be either a light-transmitting insulating material or a non-light-transmitting insulating material, or can be a light-transmitting conductive material or a non-light-transmitting conductive material. Therefore, the process of the package substrate provided by the embodiments of the present disclosure based on this scheme is less limited and has a relatively wide tolerance.

It should be noted that, in the above embodiment, a planarization layer 4 is generally disposed between the base substrate 1 and the metal electrode 2, and an orthogonal projection of the planarization layer 4 on the base substrate 1 covers the light-transmitting region and the non-light-transmitting region of the base substrate 1. Therefore, when the transition layer 21 is further formed on the surface of the light-transmitting region of the base substrate, the transition layer 21 is formed on the surface of the planarization layer 4 corresponding to the light transmitting region of the base substrate 1. That is, the transition layer is substantially indirectly formed on the surface of the light-transmitting region of the base substrate 1 through the planarization layer 4.

Similar to the above, in the display panel by serving a WOLED as a light-emitting display element, as shown in FIGS. 4, 6, and 8, the package substrates of the second to fourth structures further include a color filter layer 3. The color filter layer 3 is disposed on the surfaces of the light-transmitting region and the non-light-transmitting region of the base substrate 1 and is located below the planarization layer 4. That is, the color filter layer 3 is located between the base substrate 1 and the planarization layer 4, so that the light is colored by the color filter layer 3. Besides, when the package substrate further includes the color filter layer 3, the transition layer is substantially indirectly formed on the surface of the color filter layer 3 through the planarization layer 4.

Of course, similar to the above, the package substrates of the second to fourth structures described above further include a color filter layer 3, which can also be applied to an OLED display substrate of the RGB three-primary color OLED light emitting manner with a poor colorization effect.

Optionally, as shown in FIGS. 4, 6 and 8, the color filter layer 3 includes a black matrix 31. A color resist 32 is formed in the opening region of the black matrix 31. The orthogonal projection of the color resist 32 on the base substrate 1 is located in the light-transmitting region of the base substrate 1, and the orthogonal projection of the black matrix 31 on the base substrate 1 is located in the non-light-transmitting region of the base substrate 1. Since the light entering the package substrate passes through the opening region of the black matrix 31, this allows the color resist 32 to colorize the light transmitted through the opening region of the black matrix 31. Besides, the color resist 32 covers part of the surface of the black matrix 31, so that the color resist 32 can be firmly formed in the opening region of the black matrix 31.

In addition, the materials used in the planarization layer 4 in the first to fourth kinds of package substrates provided in the above embodiments include but are not limited to one or more organic resins, SOG materials, and benzocyclobutenes. Of course, other insulating materials may also be selected as the planarizing material. Among them, SOG is a liquid phase insulating material equivalent to $SiO_2$, specifically, a silicon-glass bonded structure.

As shown in FIGS. 4, 6 and 8, the embodiment of the present disclosure further provides a display panel. The display panel includes the package substrate provided by the above technical solution, and the metal electrode of the package substrate is connected to the light-transmitting electrode 6 on the surface of the array substrate.

Compared with the prior art, the beneficial effects of the display panel provided by the embodiments of the present disclosure are the same as those of the package substrate provided by the above technical solutions, and will not be described here.

In the embodiment, the array substrate may be an ordinary OLED array substrate or a thin film transistor array substrate.

In the above embodiments, the material of the light-transmitting electrode 6 can be selected from a wide range. For example, the material of the light-transmitting electrode 6 can be a light-transmitting semiconductor film, and the material of the light-transmitting semiconductor film is one or more of indium tin oxide (ITO), aluminum doped zinc oxide (IZO), indium-doped zinc oxide (AZO) and aluminum-titanium co-doped zinc oxide (AZTO). Considering that the metal thin film 2 can be in a light-transmitting state when it is relatively thin, therefore, the material of the light-transmitting electrode 6 is limited to be a light transmitting metal film, and the material of the light-transmitting metal film is one or more of the magnesium silver composite material, calcium silver composite material, ruthenium silver composite material, aluminum silver composite material, and germanium silver composite material. In consideration of the sufficient application of the material, it is possible to define the material of the conductive transition layer in the package substrate the same as that of the light-transmitting electrode 6, so that the number of procuring the material can be reduced.

An embodiment of the present disclosure further provides a display device, which includes the display panel provided by the above technical solutions.

Compared with the prior art, the beneficial effects of the display device provided by the embodiments of the present disclosure are the same as those of the package substrate provided by the above technical solutions, and will not be repeated here.

The display device provided by the above embodiments may be any product or component that has a display function such as a mobile phone, a tablet computer, a television set, a display, a notebook computer, a digital photo frame, or a navigator.

As shown in FIGS. 1, 3, 5, and 7, an embodiment of the present disclosure further provides a method of manufacturing a package substrate. The method of manufacturing the package substrate includes following steps:

step S1: providing a base substrate 1; the base substrate 1 having a light-transmitting region and a non-light-transmitting region;

step S2: forming metal electrodes 2 on the base substrate 1;

step S4: forming a spacer 5 on at least a part of a surface of the metal electrodes 2 away from the base substrate 1, wherein an orthogonal projection of the spacer 5 on the base substrate 1 is within an orthogonal projection of the metal electrodes 2 on the base substrate 1, and an orthogonal projection of the metal electrodes 2 on the base substrate 1 is within the non-light-transmitting region of the base substrate 1; and an interval exists between the spacer 5 and the metal electrodes 2.

Compared with the prior art, the beneficial effects of the method of manufacturing a package substrate provided by the embodiments of the present disclosure are the same as those of the package substrate provided by the above technical solutions, and are not limited herein.

When the metal electrode 2 is disposed on the surface of the base substrate 1, as shown in FIG. 1, before forming a spacer 5 on at least a part of a surface of the metal electrodes 2 away from the base substrate 1, the method of manufacturing a package substrate further includes:

forming a black matrix 31 on a surface of the metal electrodes 2 away from the base substrate 1, such that an orthogonal projection of the metal electrodes 2 on the base substrate 1 is within an orthogonal projection of the black matrix 31 on the base substrate 1;

forming a planarization layer 4 on a surface of the black matrix 31 away from the metal electrode 2 and on a surface of the light-transmitting region of the base substrate 1, such that the spacer 5 is formed on a surface of the planarization layer 4, and an orthogonal projection of the planarization layer 4 on the base substrate 1 covers the non-light-transmitting region and the light-transmitting region of the base substrate 1; the orthogonal projection of the metal electrode 2 on the base substrate 1 is located in the orthogonal projection of the planarization layer 4 on the base substrate 1.

Specifically, as shown in FIG. 1, the black matrix 31 and the metal electrode 2 may be formed in the same step, that is, the black moment 31 and the metal electrode 2 are simultaneously formed in step S2, the specific process is as follows:

step S21: forming a metal layer 20 on the surface of the base substrate 1; forming a light shielding layer 30 on the surface of the metal layer 20 away from the base substrate 1;

step S22: patterning the metal layer 20 and the light shielding layer 30 by a patterning process of one time, to obtain a matrixed metal electrode 2 and a black matrix 31 located on the surface of the metal electrode 2 away from the substrate 1. The orthogonal projection of the black matrix 31 on the substrate 1 covers the orthogonal projection of the metal electrode 2 on the base substrate 1.

In the WOLED display panel, in order to colorize the light passing through the package substrate, as shown in FIG. 1, after the step S22, the method further includes:

step S24: forming a color filter 32 in the opening region of the black matrix 31, to use the color filter 32 to colorize the light.

In addition, in order to make the surface of the package substrate as flat as possible, in general, as shown in FIG. 1, between the step S2 and the step S4, the method further includes:

step S3: forming a planarization layer 4 on the surface of the black matrix 31 and the surface of the color filter 32, so that the spacer is formed on the surface of the planarization layer 4 corresponding to the non-light-transmitting region of the base substrate 4.

Considering that the light-transmitting electrode 6 connected to the light-transmitting electrode of the OLED array substrate needs to be electrically connected to the metal electrode 2 when the package substrate and the OLED display substrate are assembled, specifically, between step S2 and the step S4, the method further includes the following step.

Step S5, an etching process is used, a planarization layer via hole 40 is provided on the planarization layer 4, and a non-light-transmitting region via hole 310 is provided on the black matrix 31, so that a non-light-transmitting region via hole 310 is formed on the black matrix 31 for communication. It is also ensured that the orthogonal projection of the non-light-transmitting region via hole 310 on the base substrate 1 coincides with the orthogonal projection of the planarization layer via hole 40 on the base substrate 1, and the orthogonal projection of spacer 5 on the base substrate 1 is independent from the orthogonal projection of the non-light-transmitting region via hole 310 on the base substrate 1. Thus, the light-transmitting electrode 6 of the OLED display substrate can be formed on the surface of the planarization layer 40 and the surface of the spacer 5 away from the planarization layer 40. In this way, the light-transmitting electrode 6 is electrically connected to the metal electrode 2 through the planarization layer via hole 40 and the non-light transmitting region via hole 310.

Figure 3:
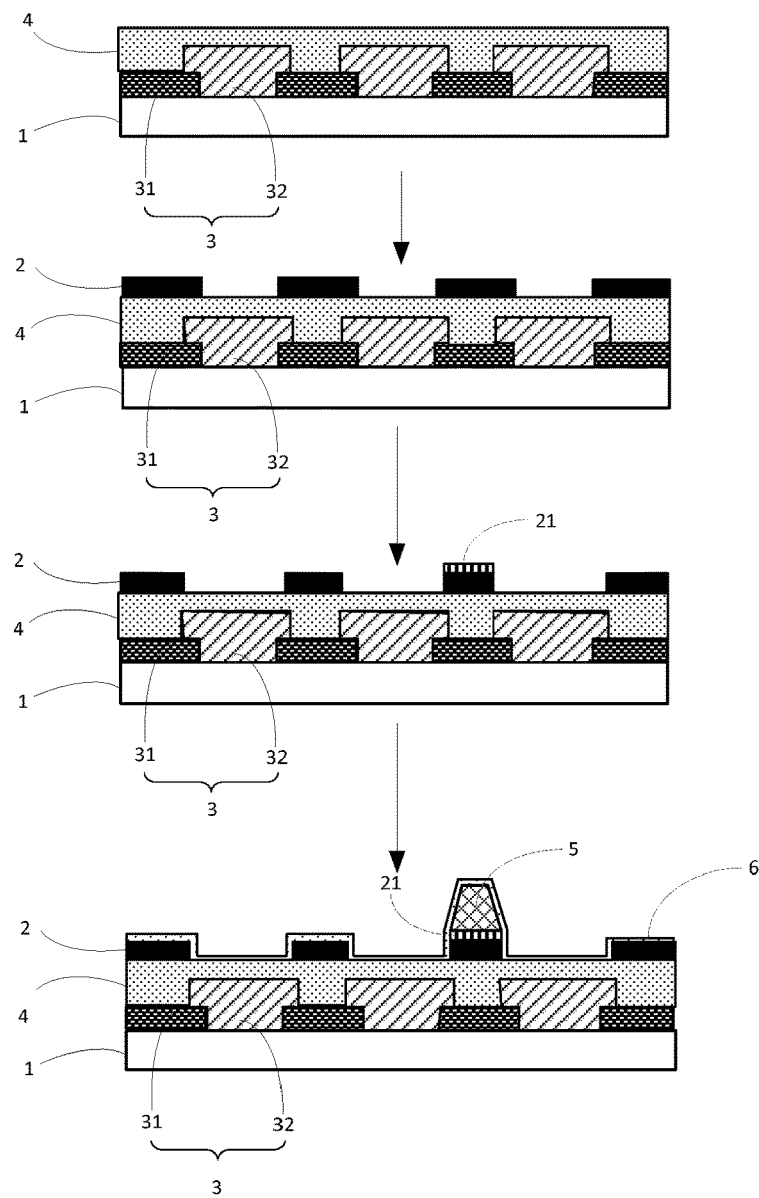
FIG. 3 is a flow chart of manufacturing a second kind of package substrate with light-transmitting electrodes according to an embodiment of the present disclosure.
Figure 5:
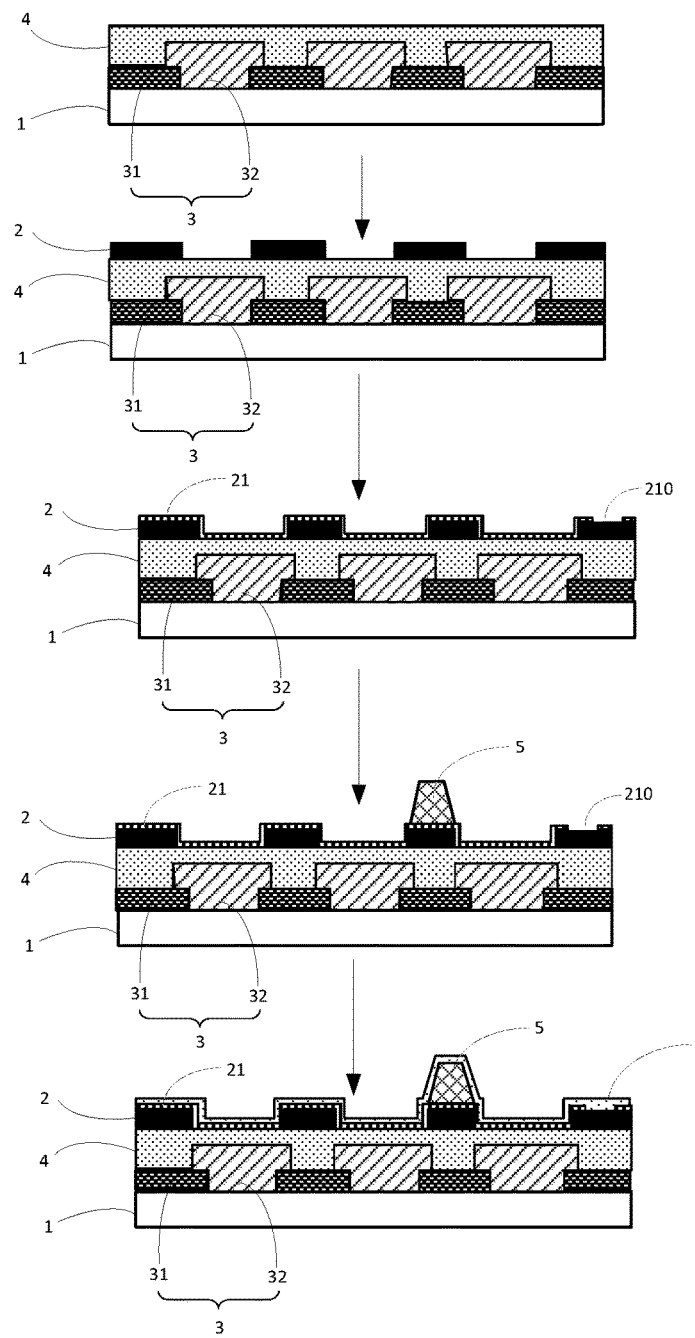
FIG. 5 is a flow chart of manufacturing a third kind of package substrate with light-transmitting electrodes according to an embodiment of the present disclosure.
Figure 7:
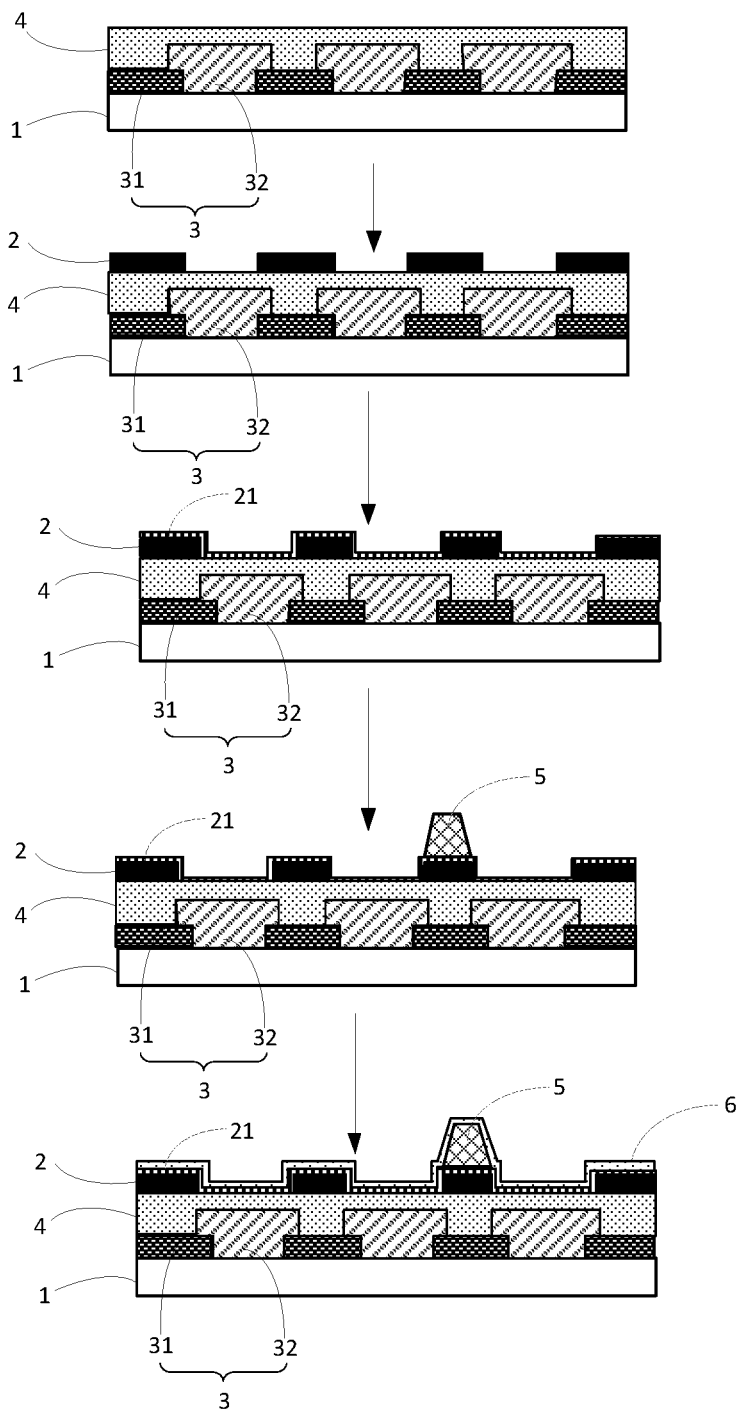
FIG. 7 is a flow chart of manufacturing a fourth kind of package substrate with light-transmitting electrodes according to an embodiment of the present disclosure.

As shown in FIGS. 3, 5 and 7, a step S3 is further included between the step S2 and step S4 in the above embodiment.

In step S3, a transition layer 21 is formed on at least a part of the surface of the metal electrodes 2, so that the spacer 5 is located on the surface of the transition layer 21 away from the metal electrode 2.

Under this structure, optionally, the following steps are further included between the step S1 and step S2 in the foregoing embodiments:

step S11: forming a color filter layer 3 on the surface of the base substrate 2; the color filter layer 3 includes a black matrix 31 and a color filter 32 formed in the opening region of the black matrix;

step 12: forming a planarization layer 4 on a surface of the color filter layer 3 away from the base substrate 2, so that the metal electrode 2 is formed on the surface of the planarization layer 4 away from the color filter layer 3; the orthogonal projection of the planarization layer 4 on the base substrate 1 covering the light-transmitting region and the non-light-transmitting region of the base substrate 1.

When the transition layer 21 is formed on at least a part of the surface of the metal electrodes 2, the method of manufacturing the package substrate provided in the above embodiments is specifically implemented in the following manner.

The first manner is shown in FIG. 3, the transition layer 21 is an insulating transition layer. In this case, a transition layer 21 is formed on the surface of some metal electrodes 2, so that all the spacers 21 form the surface of the transition layer.

When the OLED display substrate and the package substrate form a cell assembly, the light-transmitting electrode 6 in the OLED display substrate is formed on the surface of the transition layer 21 and the surface of the metal electrode 2 where the transition layer 21 is not formed, to ensure that the light-transmitting electrode 6 and the metal electrodes 2 are electrically connected.

Of course, the transition layer 21 in FIG. 3 may also be the conductive transition layer 21, and since the transition layer 21 in FIG. 3 is only formed on the surface of the metal electrode 2 but not formed elsewhere, the transition layer 21 may be a light-shielding transition layer or a light-transmitting transition layer.

The second manner is shown in FIG. 5. The transition layer 21 is an insulating transition layer, and the insulating transition layer should be light transmitting, to ensure that the insulating transition layer can be formed on the surface of the planarization layer without affecting the light transmission of the color filter layer 3. In this case, an insulating transition layer is formed on both the surface of the metal electrode 2 and the surface of the planarization layer 4, so that the spacer 5 is formed on the surface of the insulating transition layer, and the insulating transition layer can transmit light. Then a transition layer via hole 210 is provided on the insulating transition layer, so that the orthogonal projection of the transition layer via hole 210 on the base substrate 1 is located in the orthogonal projection of the metal electrode 2 on the base substrate 1, and the orthogonal projection of the spacer 5 on the base substrate 1 is independent from the transition layer via hole 210 on the base substrate 1.

When the OLED display substrate and the package substrate form a cell assembly, the light-transmitting electrode 6 of the OLED display substrate is formed on the surface of the spacer, and the light-transmitting electrode 6 should be formed on the surface of the spacer 5 and the surface of the insulating transition layer 6, such that the light-transmitting electrode 6 is electrically connected to the metal electrode 2 through the transition layer via hole 210.

The third manner is shown in FIG. 8. The transition layer 21 is a conductive transition layer, and the conductive transition layer should be light transmitting, so that when the conductive transition layer is formed on the surface of the metal electrode 2 and the surface of the planarization layer 4, it will not influence the color filter layer 3 to transmit light. In this case, a conductive transition layer is formed on the surface of the metal electrode 2 and the surface of the planarization layer 4, so that the spacer 5 is formed on the surface of the conductive transition layer.

When the OLED display substrate and the package substrate form a cell assembly, the light-transmitting electrode 6 of the OLED display substrate is formed on the surface of the spacer 5 and the surface of the conductive transition layer.

It should be noted that the beneficial effects of the method of manufacturing a package substrate provided by the embodiments of the present disclosure can be referred to the corresponding description of the structure of the package substrate above, which will not be repeated herein.

In the description of the above embodiments, specific features, structures, materials, or characteristics may be combined in any suitable manner in any one or more embodiments or examples.

The foregoing descriptions are merely specific implementation manners of the present disclosure, but the protection scope of the present disclosure is not limited thereto. Any change or the replacement easily thought of by any person skilled in the art within the technical scope disclosed by the present disclosure should be within the protection scope of the present disclosure. Therefore, the protection scope of the present disclosure should be based on the protection scope of the claims.

What is claimed is:

1. A package substrate, comprising:
   a base substrate, having a light-transmitting region and a non-light-transmitting region;
   metal electrodes, disposed on the base substrate; and
   a spacer, disposed on at least a part of a surface of the metal electrodes away from the base substrate,
   wherein an orthogonal projection of the spacer on the base substrate is smaller than an orthogonal projection of the metal electrodes on the base substrate and is within the orthogonal projection of the metal electrodes on the base substrate, and the orthogonal projection of the metal electrodes on the base substrate in cross section, coincides with an orthogonal projection of the non-light-transmitting region on the base substrate, and an interval exists between the spacer and the metal electrodes.

2. The package substrate according to claim 1, wherein the metal electrodes are provided on a surface of the non-light-transmitting region of the base substrate, a planarization layer is provided above the metal electrode, and the spacer is provided on a surface of the planarization layer away from the metal electrode, and an orthogonal projection of the planarization layer on the base substrate covers the non-light-transmitting region and the light-transmitting region of the base substrate.

3. The package substrate according to claim 2, wherein a black matrix is provided between the metal electrodes and the planarization layer, and the orthogonal projection of the metal electrodes on the base substrate is within an orthogonal projection of the black matrix on the base substrate.

4. The package substrate according to claim 3, wherein the black matrix is provided with a non-light-transmitting region via hole, and an orthogonal projection of the non-light-transmitting region via hole on the base substrate is within the orthogonal projection of the metal electrodes on the base substrate, and the orthogonal projection of the spacer on the base substrate is independent from the orthogonal projection of the non-light-transmitting region via hole on the base substrate;
   the planarization layer is provided with a planarization layer via hole communicating with the non-light-transmitting region via hole, and the orthogonal projection of the non-light-transmitting region via hole on the base substrate at least partially coincides with the orthogonal projection of the planarization layer via hole on the base substrate.

5. The package substrate according to claim 1, wherein at least a part of a surface of the metal electrodes is provided with a transition layer, and the spacer is located on a surface of the transition layer away from the metal electrodes.

6. The package substrate according to claim 5, wherein the transition layer is a light-transmitting insulating transition layer;
   a transition layer via hole is provided on the light-transmitting insulating transition layer, and an orthogonal projection of the transition layer via hole on the base substrate is within the orthogonal projection of the metal electrodes on the base substrate, and the orthogonal projection of the spacer on the base substrate is independent from the orthogonal projection of the transition layer via hole on the base substrate.

7. The package substrate according to claim 5, wherein the transition layer is a light-transmitting conductive transition layer.

8. The package substrate according to claim 5, wherein a planarization layer is provided between the base substrate and the metal electrode, and the orthogonal projection of the planarization layer on the base substrate covers the non-light-transmitting region and the light-transmitting region of the base substrate.

9. The package substrate according to claim 8, wherein the transition layer is provided on a surface of the planarization layer corresponding to the light-transmitting region of the base substrate.

10. The package substrate according to claim 5, wherein the package substrate further comprises a color filter layer, and the color filter layer is provided on a surface of the light-transmitting region and the non-light-transmitting region of the base substrate.

11. The package substrate according to claim 1, wherein the metal electrodes are formed of an elemental metal film, an alloy film, or a composite multi-layer film; the composite multi-layer film comprises a first alloy film and a second alloy film that are laminated and an elemental metal film provided between the first alloy film and the second alloy film.

12. A display panel, comprising the package substrate according to claim 1, and an array substrate forming a cell assembly with the package substrate, wherein one of metal electrode of the package substrate is connected to a light-transmitting electrode on a surface of the array substrate.

13. A display device, comprising the display panel according to claim 12.

14. The package substrate according to claim 1, wherein the spacer has a trapezoidal cross section in a plane perpendicular to the base substrate.

15. A method of manufacturing a package substrate, comprising:
  providing a base substrate; the base substrate having a light-transmitting region and a non-light-transmitting region;
  forming metal electrodes on the base substrate;
  forming a spacer on at least a part of a surface of the metal electrodes away from the base substrate,
  wherein an orthogonal projection of the spacer on the base substrate is smaller than an orthogonal projection of the metal electrodes on the base substrate and is within the orthogonal projection of the metal electrodes on the base substrate, and the orthogonal projection of the metal electrodes on the base substrate in cross section coincides with an orthogonal projection of the non-light-transmitting region on the base substrate; and an interval exists between the spacer and the metal electrodes.

16. The method of manufacturing a package substrate according to claim 15, wherein before forming a spacer on at least a part of a surface of the metal electrodes away from the base substrate, the method of manufacturing a package substrate further comprises:
  forming a black matrix on a surface of the metal electrodes away from the base substrate, such that the orthogonal projection of the metal electrodes on the base substrate is within an orthogonal projection of the black matrix on the base substrate;
  forming a planarization layer on a surface of the black matrix away from the metal electrodes and on a surface of the light-transmitting region of the base substrate, such that the spacer is formed on a surface of the planarization layer, and an orthogonal projection of the planarization layer on the base substrate covers the non-light-transmitting region and the light-transmitting region of the base substrate.

17. The method of manufacturing a package substrate according to claim 15, wherein before forming metal electrodes on the base substrate, the method of manufacturing a package substrate further comprises:
  forming a color filter layer on a surface of the base substrate;
  forming a planarization layer on a surface of the color filter layer away from the base substrate, such that the metal electrodes are formed on a surface of the planarization layer away from the color filter layer; the orthogonal projection of the planarization layer on the base substrate covers the non-light-transmitting region and the light-transmitting region of the base substrate;
  after forming the metal electrodes on the base substrate, and before forming a spacer on at least a part of a surface of the metal electrodes away from the base substrate, the method of manufacturing a package substrate further comprises:
  forming a transition layer on at least a part of the surface of the metal electrodes, such that the spacer is located on a surface of the transition layer away from the metal electrodes.

18. The method of manufacturing a package substrate according to claim 15, wherein the spacer has a trapezoidal cross section in a plane perpendicular to the base substrate.

* * * * *